(12) United States Patent
Maejima

(10) Patent No.: US 6,180,971 B1
(45) Date of Patent: Jan. 30, 2001

(54) CAPACITOR AND METHOD OF MANUFACTURING THE SAME

(75) Inventor: Yukihiko Maejima, Tokyo (JP)

(73) Assignees: Symetrix Corporation, Colorado Springs, CO (US); NEC Corporation (JP)

(*) Notice: Under 35 U.S.C. 154(b), the term of this patent shall be extended for 0 days.

(21) Appl. No.: 09/197,919

(22) Filed: Nov. 23, 1998

(30) Foreign Application Priority Data

Nov. 26, 1997 (JP) .................................................... 9-324033

(51) Int. Cl.[7] .................................................... H01L 29/76
(52) U.S. Cl. .................. 257/295; 257/296; 257/298; 257/310; 438/239; 438/240; 438/250
(58) Field of Search .................... 257/295, 298, 257/296, 300, 310; 365/145; 361/305; 438/239

(56) References Cited

U.S. PATENT DOCUMENTS

| | | |
|---|---|---|
| 5,406,447 | 4/1995 | Miyazaki . |
| 5,481,490 | 1/1996 | Watanabe et al. ............... 365/145 |
| 5,510,651 * | 4/1996 | Maniar et al. .................... 257/751 |
| 5,523,595 * | 6/1996 | Takenaka ......................... 257/295 |
| 5,798,903 * | 8/1998 | Dhote et al. .................... 361/321.1 |
| 5,822,175 * | 10/1998 | Azuma ............................ 361/321.5 |

FOREIGN PATENT DOCUMENTS

| | | |
|---|---|---|
| 0 514 547 A1 | 11/1992 | (EP) . |
| 0 766 319 A2 | 4/1997 | (EP) . |
| 0 915 522 A2 | 5/1999 | (EP) . |
| 02183569 | 7/1990 | (JP) . |

* cited by examiner

*Primary Examiner*—Matthew Smith
*Assistant Examiner*—B. Keshavan
(74) *Attorney, Agent, or Firm*—Duft, Graziano & Forest, P.C.

(57) ABSTRACT

In the manufacture of an integrated circuit memory capacitor, an underlying hydrogen barrier layer, either electrically nonconductive or conductive, is formed on a substrate. Then, the lower electrode layer and the ferroelectric/dielectric layer are formed and selectively etched. A nonconductive hydrogen barrier layer is formed on the dielectric layer and selectively etched. After a heat treatment in oxygen, the upper electrode layer and a conductive hydrogen barrier layer are successively deposited and selectively etched. The nonconductive hydrogen barrier layer covers the capacitor except for a part of the upper electrode, and the conductive hydrogen barrier layer covers a portion where there is no nonconductive hydrogen barrier layer. Thus, the underlying barrier layer, the nonconductive barrier layer and the conductive barrier layer together completely cover the memory capacitor. The dielectric layer comprises a ferroelectric or high-dielectric constant metal oxide. The nonconductive hydrogen barrier layer is typically SiN. The conductive hydrogen barrier layer is typically a metal nitride, such as TiN or AlN.

30 Claims, 4 Drawing Sheets

US 6,180,971 B1

CAPACITOR AND METHOD OF MANUFACTURING THE SAME

BACKGROUND OF THE INVENTION

1. Field of the Invention

This invention relates to a capacitor and a method of manufacturing the same, and in particular to a capacitor including a ferroelectric substance that is used for a semiconductor memory and a method of manufacturing the same.

2. Statement of the Problem

A ferroelectric memory which has a combination of a semiconductor and a ferroelectric substance, such as $Pb(Zr_{1-x}Ti_x)O_3$ (hereinafter "PZT") stores "1" and "0" in memory by using residual polarization of the ferroelectric substance. The relation between a voltage applied to the ferroelectric capacitor and the polarization is represented as a hysteresis characteristic in FIG. 16.

For example, even when a positive bias is applied and thereafter the bias is returned to zero, the polarization does not return to zero and is held at the residual polarization +Pr. Conversely, when the bias is put into negative and thereafter the bias is returned to zero, the residual polarization −Pr is obtained. These states are read out and recognized as "1" and "0", which can be used as a memory by reading them. It is known to operate as a nonvolatile memory because the information is retained even when a power source is cut off. It is important that the ferroelectric capacitor and a large-scale integrated circuit (hereinafter "LSI") are formed on the same substrate so that both operate with sufficient performance in this memory. Such a structure of a capacitor is disclosed in Japanese Unexamined Patent Publication No. Hei 7-111318/1995. FIG. 17 is a structural cross-sectional view thereof. In FIG. 17, the reference numeral 21 represents an underlying oxide film (BPSG) layer, the reference numeral 23 represents a lower electrode (Pt) layer, the reference numeral 24 denotes a PZT layer, the reference numeral 25 denotes a SiN layer, the reference numeral 26 represents an upper electrode (Pt) layer, the reference numeral 27 represents a TiN layer, the reference numeral 28 denotes a capacitor cover (NSG) layer, and the reference numeral 29 denotes an Al wiring layer.

In the capacitor having such a structure, the ferroelectric capacitor comprising lower electrode layer 23, dielectric layer 24 and upper electrode layer 26 is completely covered with SiN layer 25 and TiN layer 27. Although the SiN layer 25 and the TiN layer 27 are unnecessary to obtain a ferroelectric capacitor which operates normally, the reason for forming them will be explained.

Namely, in the normal LSI process, a heat treatment is carried out in a hydrogen atmosphere at about 400° C. after formation of an Al wiring. This heat treatment is performed to reduce MOS interface levels which are generated in each step of the MOSFET fabrication used for the LSI and to reduce the variation thereof; in particular, the variation of threshold values. It is necessary to perform the heat treatment in the hydrogen atmosphere after the formation of the capacitor to improve the characteristic of the MOSFET, which is formed in the same substrate. However, a reduction reaction takes place during such a process because the ferroelectric material, such as PZT, is generally an oxide.

Consequently, oxygen deficiency occurs in the ferroelectric substance due to the heat treatment in the hydrogen. The oxygen deficiency brings about loss of ferroelectric characteristic and an increase of leakage current. As a result, the capacitance after the heat treatment is insufficient to serve in a ferroelectric capacitor.

Therefore, it is necessary in the ferroelectric capacitor to form a cover film having a barrier characteristic against the hydrogen. Such a film may be, for example, a SiN layer 25 or a TiN layer 27. With such a structure, the ferroelectric capacitor is completely covered with these films and does not deteriorate as a result of the heat treatment in the hydrogen.

Problems of the capacitor having the above structure and a method of manufacturing the same are described here. With such a structure, it is necessary to deposit SiN on the entire surface after the ferroelectric capacitor has been formed. In consideration of density and the step coverage of the film, the deposition is carried out by use of a chemical vapor deposition (hereinafter "CVD") method.

Conventionally, the deterioration due to a variety of reduction processes after the formation of the capacitor has caused problems in the ferroelectric capacitor used in a semiconductor memory. To solve the problems, it is effective to form a cover film, such as SiN, having a barrier characteristic against the hydrogen. However, deterioration also occurs during the formation of the film because a gas containing hydrogen, such as $SiH_4$ (ammonia), is used during the deposition of the SiN. $SiH_4$ (silane) and $NH_4$ are generally used as gases for the deposition of SiN. Furthermore, a deposition temperature of 300° C. or more is required to obtain SiN having dense and excellent film quality.

Therefore, a reduction reaction occurs during the deposition due to the hydrogen contained in the gas, which results in deterioration of the ferroelectric characteristic. Thus, although the barrier characteristic is effective against the hydrogen after the deposition, deterioration takes place during the deposition itself because the reduction reaction occurs.

The above problem may be solved by using TiN that is deposited as the barrier film by a sputtering method. In contrast to SiN, however, TiN is electrically conductive, so it interferes with wiring material, such as an Al wiring pattern. Consequently, it is impossible to cover the entire capacitor.

Therefore, although no deterioration occurs by heat treatment after formation of the structure, deterioration takes place during the manufacturing process. Further, the fabrication process is excessively complex.

3. Solution to the Problem

It is an object of this invention to provide a structure of a capacitor and a method of manufacturing the same, in which a cover film on the capacitor has the barrier characteristic against hydrogen without causing deterioration of ferroelectric and dielectric characteristics.

According to the invention, a memory device has capacitor with a lower electrode layer, a dielectric layer and an upper electrode layer. A nonconductive hydrogen barrier layer is located on the capacitor except for a region on at least part of the upper electrode layer, while a conductive hydrogen barrier layer is formed at least partly in the region in which the nonconductive hydrogen barrier layer is not located.

Further, according to a method of manufacturing the capacitor of this invention, the lower electrode layer and the dielectric layer are successively deposited. After the lower electrode layer and the dielectric layer are selectively etched, the nonconductive hydrogen barrier layer is deposited on the above structure. After the nonconductive hydrogen barrier layer is selectively etched on the dielectric layer, a heat treatment is carried out at a temperature of 400° C. or more, preferably in oxygen. Thereafter, the upper electrode layer and the conductive hydrogen barrier layer are successively deposited, followed by a selective etch of the upper electrode layer and the conductive hydrogen barrier layer. In this embodiment, the upper electrode layer and the conductive hydrogen barrier layer are self-aligning. The nonconductive hydrogen barrier layer and the conductive hydrogen barrier layer may be deposited using chemical vapor deposition.

According to an alternative embodiment of the method of manufacturing a capacitor of this invention, the lower electrode layer and the dielectric layer are successively deposited on a base substrate. After the lower electrode layer and the dielectric layer are selectively etched, the nonconductive hydrogen barrier layer is deposited on the above structure. After the nonconductive hydrogen barrier layer is selectively etched on the dielectric layer, a heat treatment is carried out at a temperature of 400° C. or more, preferably in oxygen. Then, an electrode layer is deposited and selectively etched to form the upper electrode layer, and thereafter the conductive hydrogen barrier layer is deposited and selectively etched. In this embodiment, the upper electrode layer and the conductive hydrogen barrier layer are patterned separately and are, therefore, not self-aligned with each other. Rather, the conductive hydrogen barrier layer covers more than just the upper electrode.

In an embodiment of the invention, an underlying electrically nonconductive hydrogen barrier is located below the lower electrode layer on the entire surface of the base substrate on which the capacitor is formed. In another embodiment of the invention, an underlying conductive hydrogen barrier layer is located below the lower electrode layer and is etched and patterned together with the lower electrode layer. The base substrate may be a silicon substrate. According to the invention, a base insulating film may be located on the substrate. The underlying conductive hydrogen barrier layer or the underlying nonconductive hydrogen barrier layer may be located directly on a substrate or on an insulating film that is on the substrate. An integrated circuit may also be located on the substrate.

When the nonconductive hydrogen barrier layer is etched, an opening corresponding to the upper electrode is formed. The heat treatment in oxygen, before deposition of the upper electrode layer and the conductive hydrogen barrier layer, serves to recover the deterioration of properties of the dielectric layer caused by reduction reactions in prior manufacturing processes.

Furthermore, after deposition of the upper electrode layer and the conductive hydrogen barrier layer, the opening through the nonconductive hydrogen barrier is completely covered with the conductive hydrogen barrier layer. Consequently, the above structure possesses a barrier characteristic against the hydrogen process after formation of the capacitor, resulting in no deterioration in the dielectric layer during subsequent reducing processes.

A feature of the invention is that the dielectric layer may contain a ferroelectric material or a high dielectric-constant material. The ferroelectric material is a ferroelectric metal oxide, such as $Pb(Zr,Ti)O_3$ and $SrBi_2Ta_2O_9$. The high dielectric-constant material is a nonferroelectric dielectric metal oxide, such as $(Sr,Ba)TiO_3$.

The nonconductive hydrogen barrier layers may comprise SiN. It is a feature of the invention that a SiN film or other nonconductive hydrogen barrier layer may be deposited using a chemical vapor deposition method. The conductive hydrogen barrier layers typically comprise a metal nitride. Such metal nitrides include TiN and AlN.

The conductive hydrogen barrier layer may be located directly on the upper electrode layer. Also, a buffer film may be located on the upper electrode, with the conductive hydrogen barrier layer located on the buffer film.

After the upper electrode and the conductive hydrogen barrier layer are patterned into the predetermined shape, typically an insulating capacitor cover layer is deposited on the capacitor, a contact hole is formed by the etching, and an Al wiring pattern is formed. The capacitor cover layer may be formed using a chemical vapor deposition method.

Usually after the insulating film and wiring layer are formed, a hydrogen heat treatment may be conducted, typically at a temperature of 300° C. or higher.

Therefore, the heat treatment in the hydrogen can be carried out to improve the characteristic of the MOSFET. Consequently, a memory having an excellent characteristic can be obtained with an excellent yield.

DETAILED DESCRIPTION OF THE PREFERRED EMBODIMENT

1. Overview

This description focuses principally on capacitors containing ferroelectric oxide material, such as PZT and $SrBi_2Ta_2O_9$. But the structure and method of the invention are also useful when a capacitor contains nonferroelectric dielectric material, such as $(Sr,Ba)TiO_3$. Since all ferroelectric oxides are also dielectric materials, the general term "dielectric" as used in this disclosure refers both to ferroelectric oxides and to nonferroelectric dielectric oxides.

This description also focuses on the preferred embodiment, in which the conductive hydrogen barrier layers comprise TiN, and the nonconductive hydrogen barrier layers comprise SiN. But the structures and methods of the invention are useful with other compositions of material.

It should be understood that the FIGS. 1–15 depicting integrated circuit devices in accordance with the invention are not meant to be actual plan or cross-sectional views of any particular portion of an actual integrated circuit device. In the actual devices, the layers will not be as regular and their thicknesses may have different proportions. The various layers in actual devices often are curved and possess overlapping edges. The figures instead show idealized representations which are employed to depict more clearly and fully the structures and methods of the invention than would otherwise be possible. Also, the figures represent only one of innumerable variations of ferroelectric devices that could be fabricated using the method of the invention.

The terms of orientation herein, such as "above", "upper" and "over", and "below", "lower" and "underlying", relate to the silicon substrate 102. For example, if a second element is "above" a first element, it means it is farther from the substrate 102; and if it is "below" another element, then it is closer to the substrate 102 than the other element. The long dimension of substrate 102 defines a plane that is considered to be a "horizontal" plane herein, and directions perpendicular to this plane are considered to be "vertical". To "cover" an object means over and extending the entire breadth and width of an object. None of the above terms necessarily include the limitation of being in direct contact, though in some embodiments an element that is above, over, below, or underlying another element can also be in direct contact with the other element.

For the sake of clarity, the same reference numbers have been used to identify similar elements among the different embodiments of the invention depicted in the figures.

2. Detailed Description

Figure 1:
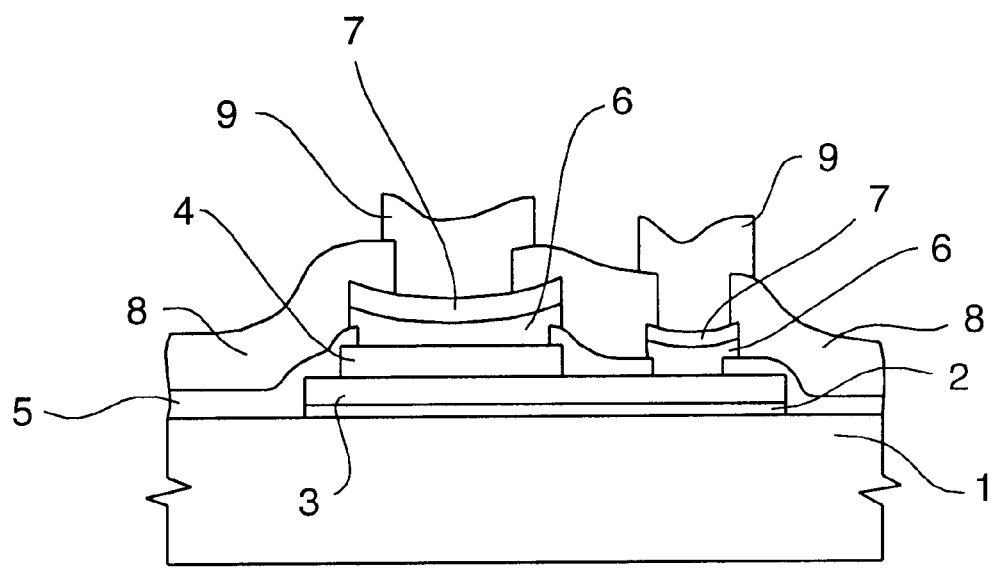
FIG. 1 is a cross-sectional view showing a first embodiment of a capacitor of this invention.

FIG. 1 is a cross-sectional view showing a capacitor according to a first embodiment of this invention. In FIG. 1, the reference numeral 1 represents a base insulating film (e.g., boron phospho-silicate glass, hereinafter "BPSG"); the reference numeral 2 represents an underlying, first conductive hydrogen barrier layer (e.g., TiN); the reference numeral 3 denotes a lower electrode layer (e.g., Pt); the reference numeral 4 denotes a dielectric layer (e.g., PZT); the reference numeral 5 represents a nonconductive hydrogen barrier layer (e.g., SiN); the reference numeral 6 represents an upper electrode layer (e.g., Pt); the reference numeral 7 denotes a second conductive hydrogen barrier layer (e.g., TiN); the reference numeral 8 denotes a capacitor cover layer (e.g., NSG); and the reference numeral 9 represents a wiring layer (e.g., Al).

In such a structure of a capacitor according to the first embodiment illustrated in FIG. 1, a ferroelectric capacitor comprising a lower electrode layer 3, a dielectric layer 4, and an upper electrode layer 6, which are formed on the base insulating film 1, is completely enclosed within nonconductive hydrogen barrier layer 5 and the first and second conductive hydrogen barrier layers 2 and 7. Consequently, no deterioration of capacitor electronic properties occurs even when a heat treatment in hydrogen is conducted after formation of the capacitor.

The dielectric layer typically comprises a metal oxide material, such as $Pb(Zr_{1-x}Ti_x)O_3$, $SrBi_2Ta_2O_9$ (hereinafter "SBT") and $(Ba_{1-x}Sr_x)TiO_3$ 9 (hereinafter "BST"). The upper electrode layer 6 and the lower electrode layer 3 typically include materials such as Pt, Ir, $IrO_2$, Ru and $RuO_2$.

An electrically conductive hydrogen barrier layer typically comprises a metal nitride, such as titanium nitride (hereinafter "TiN") or aluminum nitride (hereinafter "AlN"). A nonconductive hydrogen barrier layer typically comprises a material such as silicon nitride (hereinafter "SiN").

The capacitor is formed directly on a substrate, such as a silicon substrate, or on a base insulating film located between the substrate and the capacitor. An integrated circuit can be formed on the substrate.

The term "self-aligned" is used to refer to one or more layers formed and patterned in such a manner that they automatically align with one or more other layers. For example, if upper electrode layer 6 and second conductive hydrogen barrier layer 7 are patterned together in the same photomask and etch patterning process, they will be self-aligned.

Although the conductive hydrogen barriers, such as TiN, are conductive, the first conductive hydrogen barrier layer 2 and second conductive hydrogen barrier layer 7 are integrated with and self-aligned with the lower and upper electrode layers 3 and 6, respectively. Consequently, in the embodiment depicted in FIG. 1, the conductive hydrogen barriers do not electrically contact with the dielectric layer 4 of the capacitor. In the above structure, the lower portion of the capacitor is covered with the underlying, or first, conductive hydrogen barrier layer 2, while most of the side surface and the upper surface is covered with the nonconductive hydrogen barrier layer 5. The portion of the upper surface having no nonconductive hydrogen barrier layer 5 is covered with the second conductive hydrogen barrier layer 7.

Therefore, the capacitor possesses a barrier against the hydrogen or the reduction atmosphere. Further, the second conductive hydrogen barrier layer 7 may be formed directly or via a buffer layer (not shown) on the upper electrode layer 6.

Figure 2:
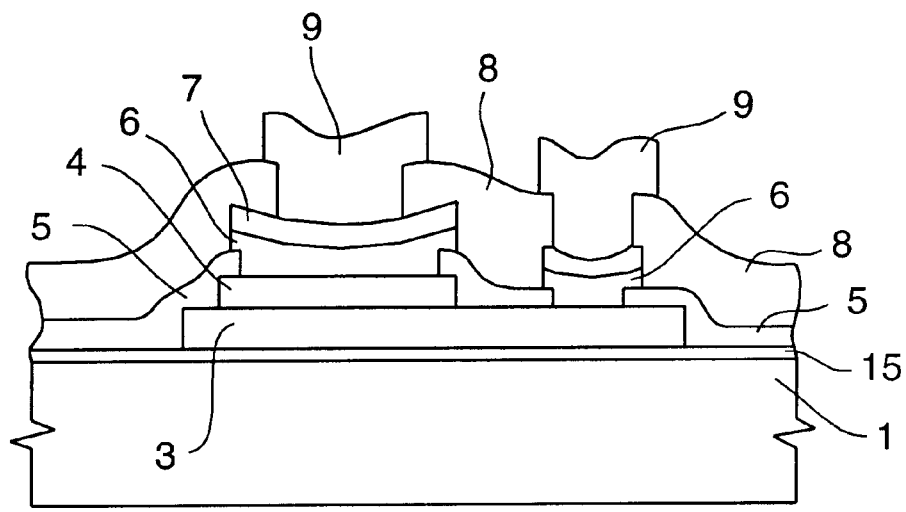
FIG. 2 is a cross-sectional view showing a second embodiment of a capacitor of this invention.

FIG. 2 is a cross-sectional view showing a capacitor according to a second embodiment of this invention. In the second embodiment, an underlying, or first, nonconductive hydrogen barrier layer 15 is formed over the entire base insulating film 1, instead of a first conductive hydrogen barrier layer 2, as in the first embodiment. In this embodiment, the lower portion of the capacitor is covered with the first nonconductive hydrogen barrier layer 15 to obtain the same barrier effect as in the first embodiment.

Figure 3:
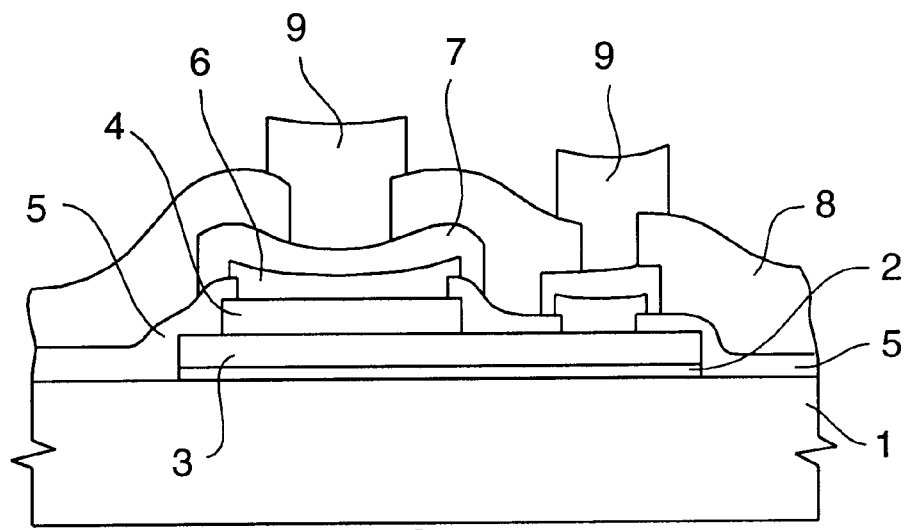
FIG. 3 is a cross-sectional view showing a third embodiment of a capacitor of this invention.

FIG. 3 is a cross-sectional view showing a capacitor according to a third embodiment of this invention. In the third embodiment, the upper electrode layer 6 is not self-aligned with the second conductive hydrogen barrier layer 7. Further, the second conductive hydrogen barrier layer 7 in the third embodiment is larger in shape than the second conductive hydrogen barrier layer 7 in the first embodiment.

In the first and second embodiments, hydrogen that slightly invades from the side surface of the upper electrode layer 6 may react with the ferroelectric or dielectric substance in a reduction reaction because the upper electrode layer 6 does not act as a barrier against hydrogen. In the structure of FIG. 3, on the other hand, the barrier effect is further improved in comparison with the first and second embodiments because the side surface of the upper electrode layer 6 is also covered with the second conductive hydrogen barrier layer 7.

The fabrication of the capacitor according to the embodiment depicted in FIG. 1 is described with reference to FIGS. 4–15. An underlying, or first, conductive hydrogen barrier layer 2, a lower electrode layer 3, and a dielectric layer 4 are successively deposited on a substrate (not shown). After the first conductive hydrogen barrier layer 2, the lower electrode layer 3, and the dielectric layer 4 are selectively etched, a nonconductive hydrogen barrier layer 5 is deposited on the above structure. After the nonconductive hydrogen barrier layer 5 is selectively etched on the dielectric layer 4, a heat treatment is carried out at 400° C. or higher. The heat treatment is carried out in an oxygen atmosphere after the nonconductive hydrogen barrier layer 5 is partially removed from the dielectric layer 4. Thereafter, an upper electrode layer 6 and a second conductive hydrogen barrier layer 7 are successively deposited and selectively etched to form the upper electrode layer 6 and the second conductive hydrogen barrier layer 7.

After the upper electrode layer 6 and the second conductive hydrogen barrier layer 7 are patterned, a capacitor cover layer (insulating film) 8 is formed on the entire surface.

Capacitor cover layer 8 is deposited preferably by the use of a chemical vapor deposition ("CVD") method. Further, after a wiring layer 9 is formed on the capacitor, a heat treatment is performed in a hydrogen atmosphere. The heat treatment in the hydrogen atmosphere is conducted at a temperature of 300° C. or higher.

In the structure illustrated in FIG. 2, an underlying, or first, nonconductive hydrogen barrier layer 15 is formed instead of a first conductive hydrogen barrier layer 2. The nonconductive hydrogen barrier layers 5 and 15 are deposited by use of a CVD method.

FIGS. 4–15 depict schematic cross-sectional views of successive steps in the manufacture of a capacitor according to the first embodiment.

Figure 4:
FIGS. 4–15 are a series of cross-sectional views showing successive steps of a method of manufacturing the capacitor of the first embodiment, shown in FIG. 1.

In the step depicted in FIG. 4, the underlying, or first, conductive hydrogen barrier layer 2, the lower electrode layer 3, and the dielectric layer 4 are successively deposited on the base insulating film (not shown in FIG. 4). In the step depicted in FIG. 5, the dielectric layer 4, the lower electrode layer 3, and the first conductive hydrogen barrier layer 2 are selectively etched to form a pattern of the lower electrode. In the step depicted in FIG. 6, the dielectric layer 4 is selectively etched to form a pattern of the capacitor. In the step depicted in FIG. 7, nonconductive hydrogen barrier layer 5 is deposited on the entire surface. Thereafter, in the step depicted in FIG. 8, portions of nonconductive hydrogen barrier layer 5 are selectively etched down to dielectric layer 4 and lower electrode 3.

Figure 9:
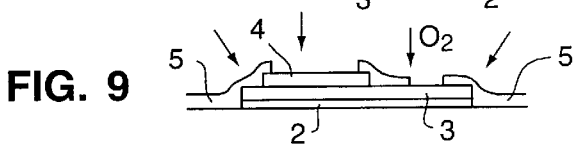

Next, the heat treatment is carried out in the oxygen atmosphere in the step depicted in FIG. 9. Thus, the oxygen deficiency due to the reduction reaction during the deposition of nonconductive hydrogen barrier layer 5 is compensated. In the step depicted in FIG. 10, upper electrode layer 6 and second conductive hydrogen barrier layer 7 are successively deposited on the entire surface, to be selectively etched to the desired shape in the step depicted in FIG. 11. In such a structure, the second conductive hydrogen barrier layer 7 is located in a region from which the nonconductive hydrogen barrier layer 5 was etched out.

Figure 12:
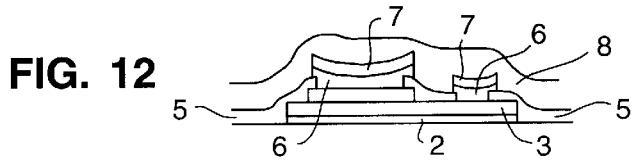

Subsequently, capacitor cover layer 8 is deposited on the entire surface in the step depicted in FIG. 12. In the step depicted in FIG. 13, capacitor cover film layer 8 is selectively etched to form contact holes. In the step depicted in FIG. 14, the wiring layer 9 is deposited on the entire surface, to be selectively etched in the step depicted in FIG. 15.

In a capacitor according to the invention, no deterioration is caused by the hydrogen treatment after the formation of the capacitor. In addition, no problem results from deterioration due to reduction during the manufacturing steps.

In reference again to FIGS. 4–15, successive steps of the manufacture of a capacitor with the structure in accordance with the first embodiment are described in detail.

In the preferred embodiment, the underlying, or first, conductive hydrogen barrier layer 2 of TiN, the lower electrode layer 3 of Pt, and the dielectric layer 4 of PZT are successively deposited on the base insulating film 1 (BPSG) in the step depicted in FIG. 4. These layers may be deposited by use of a sputtering method. However, the PZT may be formed by a sol-gel method. The TiN and Pt have suitable properties when they are deposited at room temperature. On the other hand, to possess good ferroelectric properties, it is necessary that the PZT have good crystallinity. To this end, a crystallization temperature of about 600° C. is required. Other crystalline ferroelectric and dielectric materials also require similarly high heat-treatment temperatures in oxygen.

Further, TiN may be deposited by a CVD method. The film thickness of TiN is about 100 nm while the film thickness of Pt and dielectric is about 200 nm. In the structure according to the second embodiment, an underlying nonconductive hydrogen barrier layer 15 of SiN with about 50 nm thickness is deposited, instead of an underlying, or first, conductive hydrogen barrier layer 2. In this case, a deposition method for obtaining good film quality, such as a CVD method, is desirable.

Figure 5:
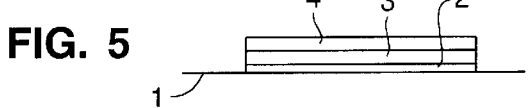

Subsequently, in the step depicted in FIG. 5, the dielectric layer 4, the lower electrode layer 3, and the first, underlying conductive hydrogen barrier layer 2 are selectively etched to form a pattern of the lower electrode layer 3. This process is carried out by the use of reactive ion etching (hereinafter "RIE") using a photoresist as a mask. Although a chlorine-based gas is used in this case, an excellent etching shape can be obtained by changing the species and composition of the gas in the course of the process. In the case of the second embodiment, it is unnecessary to etch the underlying nonconductive hydrogen barrier layer 15.

Figure 6:
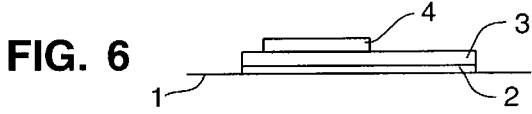
Figure 7:
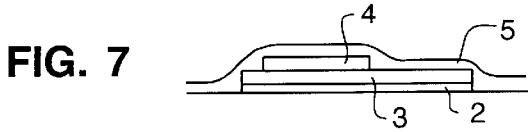
Figure 8:
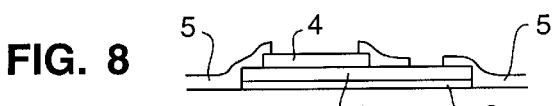

In the step depicted in FIG. 6, the dielectric layer 4 is selectively etched to obtain a pattern for forming the ferroelectric capacitor. This process is carried out by the use of a photoresist mask and RIE. Subsequently, in the step depicted in FIG. 7, the nonconductive hydrogen barrier layer 5 is deposited to a thickness of about 50 nm on the entire surface. A plasma CVD method, in which, for example, $SiH_4$ and $NH_3$ are used as the reaction gases, is used as the deposition method. A dense SiN film having barrier properties against hydrogen is obtained by setting the temperature during the deposition to 300° C. or higher. During this time, however, a reduction reaction takes place because of the hydrogen contained in the reaction gas, as described above. As a result, the dielectric layer 4, which is patterned in the step depicted in FIG. 6, is put into a state of oxygen deficiency. In this state, the ferroelectric characteristic is degraded. Subsequently, the nonconductive hydrogen barrier layer 5 is selectively etched in the step depicted in FIG. 8. This can be realized by the use of RIE in which $CHF_3$ or $CF_4$ is used as the gas and a photoresist mask is used. Thus, the etched portions correspond to contact openings to the upper electrode layer 6 on the dielectric layer 4 and to a part of the lower electrode layer 3. In this step, a reduction reaction occurs in the dielectric layer 4, resulting in an oxygen deficiency, particularly when $CHF_3$ is used, because hydrogen is contained in the reactive gas.

Next, in the step depicted in FIG. 9, a heat treatment is conducted in an oxygen atmosphere. The oxygen deficiency generated in the steps depicted in FIGS. 7–8 can be compensated by setting the temperature to about 600° C., which is the crystallization temperature of the metal oxide PZT material in dielectric layer 4.

Thus, the ferroelectric (or high dielectric constant) characteristic is recovered by this process. The nonconductive hydrogen barrier layer 5 acts as a barrier against oxygen, as well as against hydrogen. Yet, oxygen is sufficiently supplied to the dielectric layer 4 because the nonconductive hydrogen barrier layer 5 is selectively etched on the dielectric layer 4. If the opening in accordance with the invention were not formed on the dielectric layer 4, the characteristic would not be recoverable because oxygen would not be sufficiently supplied.

Figure 10:
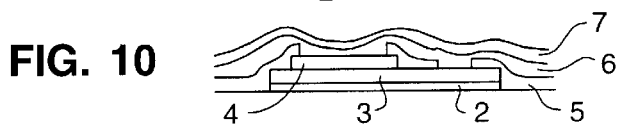

Subsequently, the upper electrode layer 6 of Pt and the second conductive hydrogen barrier layer 7 of TiN are successively deposited on the entire surface in the step depicted in FIG. 10. These layers are deposited by the use of a sputtering method, mentioned above. The film thicknesses are about 200 nm and 100 nm, respectively. Although TiN can be deposited by a CVD method, as mentioned above, it is preferable to use a sputtering method, which causes no deterioration by reduction.

Figure 11:
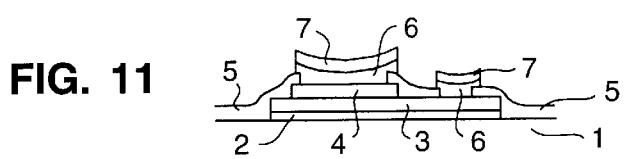

Next, these layers are selectively etched to the desired shape in the step depicted in FIG. 11. This process is performed by the use of RIE in which chlorine-based gas is used with a photoresist mask. In this pattern, the openings formed in the step depicted in FIG. 8 remain completely covered. Thereby, the second conductive hydrogen barrier layer 7 is patterned in the portions from which the nonconductive hydrogen barrier layer 5 was etched in this structure.

Thus, the capacitor is completely covered with either nonconductive SiN or conductive TiN in all directions, and has a structure possessing sufficient barrier properties against hydrogen.

In the case where a structure according to the third embodiment is manufactured, as depicted in FIG. 3, the upper electrode layer 6 and the second conductive hydrogen barrier layer are not successively deposited. Instead, the upper electrode layer 6 is first deposited and patterned, then the second conductive hydrogen barrier layer 7 is deposited for patterning. Thereby, the second conductive hydrogen barrier layer 7 can be wider than the upper electrode layer 6.

Subsequently, in the step depicted in FIG. 12, the capacitor cover layer 8 of NSG is deposited to a thickness of about 400 nm on the entire surface. In such a structure, many deposition methods providing excellent step coverage are utilizable as the deposition method, such as a normal pressure CVD method that uses TEOS (tetraethoxysilane) and does not cause reduction, and a plasma CVD method that uses $SiH_4$ and does cause reduction.

Figure 13:
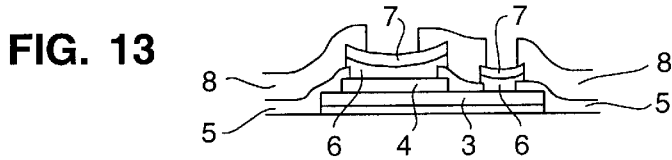

Next, in the step depicted in FIG. 13, the capacitor cover layer 8 is selectively etched to form the contact holes. In this process, RIE with $CHF_3$ and $CF_4$ is used as in the step depicted in FIG. 8. But deterioration due to hydrogen does not occur, even when $CHF_3$ is used, because of the cover of SiN and TiN.

Figure 14:
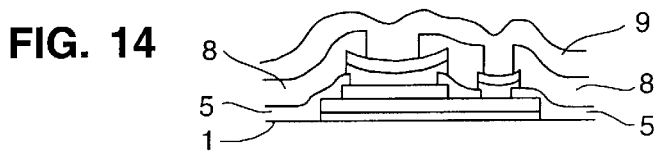
Figure 15:
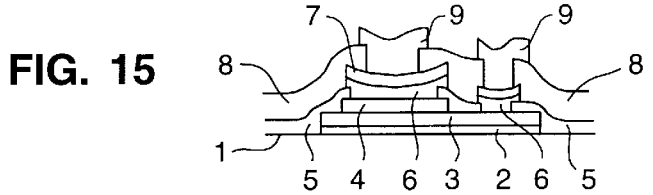
Figure 16:
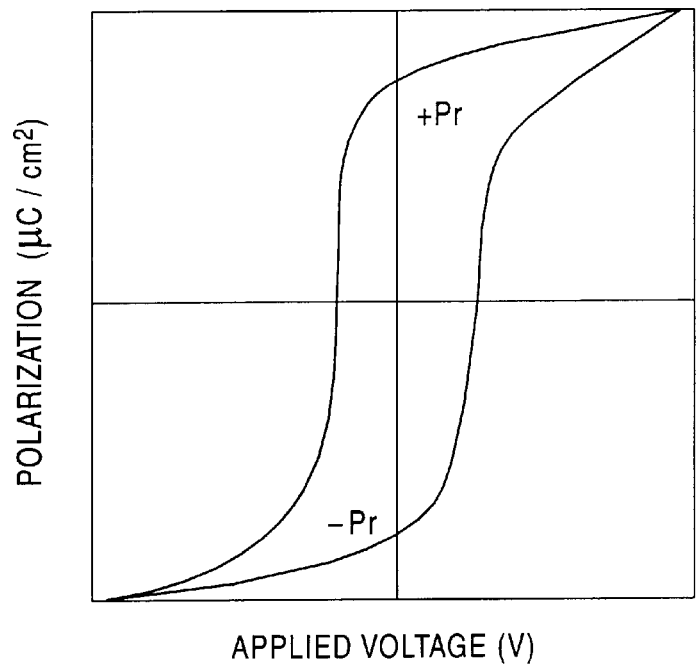
FIG. 16 is a characteristic diagram showing an example of hysteresis characteristic between a voltage applied to the conventional ferroelectric capacitor and polarization obtained at that time.
Figure 17:
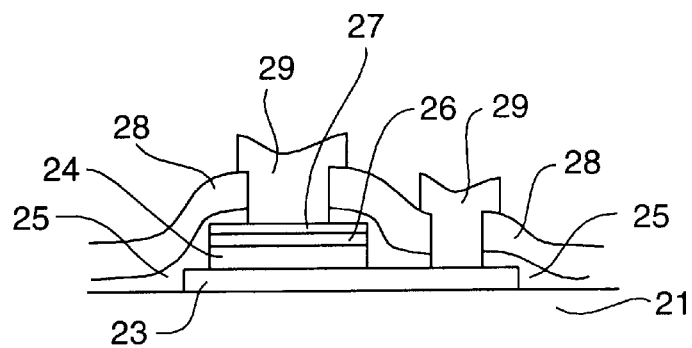
FIG. 17 is a structural cross-sectional view showing an example of the conventional capacitor.

In the step depicted in FIG. 14, wiring layer 9 is deposited on the entire surface. This layer is, for example, a laminate structure that has Al of about 500 nm, TiN of about 100 nm, and Ti of about 50 nm, and which is deposited by a sputtering method. It is possible to use a CVD method, which causes a reduction atmosphere, for the deposition of Al and TiN because the barrier against the reduction atmosphere is in place. In this manner, the contact resistance is reduced, and further, the yield for the memory device is improved because the step coverage is much better than with a sputtering method. Next, in the step depicted in FIG. 15, this structure is selectively etched. In this step, a photoresist mask and RIE with $Cl_2$ are used.

A capacitor having barrier properties against hydrogen or a reduction atmosphere can be formed using the above steps. Even when a heat treatment of the capacitor is thereafter conducted in a hydrogen atmosphere at 300° C. or higher, deterioration of capacitor properties does not occur. Therefore, when a MOSFET is formed on the same base substrate on which the capacitor is formed according to this invention, the capacitor characteristic can be improved. In particular, the characteristic and the yield of the semiconductor memory using the capacitor can be enhanced.

The ferroelectric substance mentioned for use in the embodiments described above is PZT. However, other ferroelectric substance material, such as $SrBi_2Ta_2O_9$, or high dielectric-constant material such as $(Ba_{1-x}Sr_x)TiO_3$, may be used in this invention.

Herein, it has thus far been assumed that Pt or the laminate structure of Pt/Ti is used as the material of the upper electrode layer 6 and the lower electrode layer 3. But other materials that achieve a good capacitor characteristic, such as Ir, $IrO_2$, Ru and $RuO_2$, may be used and can serve to obtain the same effect.

According to the capacitor and the method of manufacturing the same of this invention, a nonconductive hydrogen barrier layer covers the capacitor except for a region on the upper electrode, while a conductive hydrogen barrier layer is formed in the region which the nonconductive hydrogen barrier film does not cover, as described above. Consequently, a capacitor with a structure having the barrier characteristic against hydrogen or a reduction atmosphere can be obtained and, furthermore, deterioration can be suppressed in the manufacturing process. Therefore, the properties and the yield of the semiconductor memory can be improved.

There has been described a method for fabricating ferroelectric and high dielectric-constant devices in integrated circuits that permits exposure to hydrogen and still results in ferroelectric and dielectric devices with good electrical properties. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. It is also evident that the steps recited may, in some instances, be performed in a different order; or equivalent structures, compositions and processes may be substituted for the various structures, compositions and processes described. Consequently, the invention is to be construed as embracing each and every novel feature and novel combination of features present in and/or possessed by the fabrication processes, electronic devices, and electronic device manufacturing methods described.

What is claimed is:

1. A memory device comprising:
 a capacitor, said capacitor having a lower electrode, a dielectric layer, and an upper electrode;
 a nonconductive hydrogen barrier layer, said nonconductive hydrogen barrier layer covering said capacitor, except for a region including at least a part of said upper electrode; and
 a conductive hydrogen barrier layer, at least part of said conductive hydrogen barrier layer completely covering said region that said nonconductive hydrogen barrier layer does not cover.

2. A memory device as claimed in claim 1, wherein:
 said nonconductive hydrogen barrier layer comprises SiN.

3. A memory device as claimed in claim 1, wherein:
 said conductive hydrogen barrier layer comprises a metal nitride.

4. A memory device as claimed in claim 3, wherein:
 said metal nitride comprises one selected from the group consisting of TiN and AlN.

5. A memory device as claimed in claim 1, wherein:
 an underlying conductive hydrogen barrier layer is located under said lower electrode.

6. A memory device as claimed in claim 5, wherein:
 said underlying conductive hydrogen barrier layer comprises a metal nitride.

7. A memory device as claimed in claim 6, wherein:
 said metal nitride comprises one selected from the group consisting of TiN and AlN.

8. A memory device as claimed in claim 5, wherein:
 said underlying conductive hydrogen barrier layer is formed directly on a silicon substrate.

9. A memory device as claimed in claim 8, wherein:
an integrated circuit is formed on said silicon substrate.

10. A memory device as claimed in claim 5, wherein:
a base insulating film is formed on a silicon substrate; and
said underlying conductive hydrogen barrier layer is formed on said base insulating film.

11. A memory device as claimed in claim 10, wherein:
an integrated circuit is formed on said silicon substrate.

12. A memory device as claimed in claim 5, characterized in that:
said capacitor is completely enclosed in all directions by said nonconductive hydrogen, said conductive hydrogen barrier layer, and said underlying conductive hydrogen barrier layer.

13. A memory device as claimed in claim 1, wherein:
an underlying nonconductive hydrogen barrier layer is located under said lower electrode.

14. A memory device as claimed in claim 13, wherein:
said underlying nonconductive hydrogen barrier layer comprises SiN.

15. A memory device as claimed in claim 13, wherein:
said underlying nonconductive hydrogen barrier layer is formed directly on a silicon substrate.

16. A memory device as claimed in claim 15, wherein:
an integrated circuit is formed on said silicon substrate.

17. A memory device as claimed in claim 8, wherein:
a base insulating film is formed on a silicon substrate; and
said underlying nonconductive hydrogen barrier layer is formed on said base insulating film.

18. A memory device as claimed in claim 17, wherein:
an integrated circuit is formed on said silicon substrate.

19. A memory device as claimed in claim 8, characterized in that:
said capacitor is completely enclosed in all directions by said nonconductive hydrogen barrier layer, said conductive hydrogen barrier layer, and said underlying nonconductive hydrogen barrier layer.

20. A memory device as claimed in claim 1, wherein:
said conductive hydrogen barrier layer is located directly on said upper electrode.

21. A memory device as claimed in claim 1, further comprising:
a buffer film located on said upper electrode;
wherein said conductive hydrogen barrier layer is located on said buffer film.

22. A memory device as claimed in claim 1, wherein:
said dielectric layer comprises one selected from the group consisting of $Pb(Zr_{1-x}Ti_x)O_3$, $SrBi_2Ta_2O_9$ and $(Ba_{1-x}Sr_x)TiO_3$.

23. A memory device as claimed in claim 1, wherein:
each of said upper electrode and said lower electrode comprises one selected from a group consisting of Pt, Ir, $IrO_2$, Ru and $RuO_2$.

24. A memory device as claimed in claim 1, characterized in that:
said nonconductive hydrogen barrier layer has a contact opening to said dielectric layer;
said upper electrode fills said contact opening; and
said conductive hydrogen barrier layer completely covers said contact opening.

25. A memory device as claimed in claim 24, characterized in that:
said conductive hydrogen barrier layer and said upper electrode are self-aligned.

26. A memory device as claimed in claim 1, characterized in that:
said upper electrode has a side surface; and
said conductive hydrogen barrier covers said side surface.

27. A memory device as claimed in claim 1, characterized in that:
said capacitor has an upper surface and a side surface; and
said conductive hydrogen barrier layer covers said upper surface and said side surface.

28. A memory device comprising:
a capacitor, said capacitor having a lower electrode, a dielectric layer, and an upper electrode, said dielectric layer having an upper surface adjacent said upper electrode, a lower surface adjacent said lower electrode, and side surfaces between said upper and lower surfaces;
a non-conductive nitride layer and a conductive metal nitride layer; and
said non-conductive nitride layer and said conductive metal nitride layer together covering said side surfaces and said upper surface of said dielectric.

29. A memory device as in claim 28 wherein said non-conductive nitride layer covers said side walls and a portion of said upper surface, and said conductive metal nitride layer completely covers the remaining portion of said upper surface not covered by said non-conductive nitride layer.

30. A memory device as in claim 29 wherein said non-conductive and said conductive metal nitride layer are in contact so that said side surfaces and said upper surface are encapsulated by said non-conductive nitride layer and said conductive metal nitride layer.

* * * * *